United States Patent
Park et al.

(10) Patent No.: US 9,449,818 B2
(45) Date of Patent: Sep. 20, 2016

(54) DOUBLE SIDED SI(GE)/SAPPHIRE/III-NITRIDE HYBRID STRUCTURE

(71) Applicant: The United States of America as represented by the Administrator of the National Aeronautics and Space Administration, Washington, DC (US)

(72) Inventors: Yeonjoon Park, Yorktown, VA (US); Sang Hyouk Choi, Poquoson, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 14/204,535

(22) Filed: Mar. 11, 2014

(65) Prior Publication Data

US 2014/0264325 A1    Sep. 18, 2014

Related U.S. Application Data

(60) Provisional application No. 61/783,807, filed on Mar. 14, 2013.

(51) Int. Cl.
  *H01L 29/267*  (2006.01)
  *H01L 31/0336*  (2006.01)
  (Continued)

(52) U.S. Cl.
  CPC ..... *H01L 21/02554* (2013.01); *H01L 21/0242* (2013.01); *H01L 21/0254* (2013.01); *H01L 21/02433* (2013.01); *H01L 21/02532* (2013.01); *H01L 27/15* (2013.01); *H01L 29/267* (2013.01); *H01L 31/028* (2013.01);
  (Continued)

(58) Field of Classification Search
  CPC .................................................... H01L 31/125
  See application file for complete search history.

(56) References Cited

U.S. PATENT DOCUMENTS 7,558,371 B2    7/2009    Park et al.
7,769,135 B2    8/2010    Park et al.
(Continued)

OTHER PUBLICATIONS

Suraj J. Mathew, William E. Ansley, Wadad B. Dubbelday, John D. Cressler, John Ott, Jack O. Chu, Bernard S. Meyerson, Karen L. Kavanagh, Patricia M. Mooney, and Isaac Lagnado; "Effect of GE Profile on the Frequency Response of a SiGe pFET on Sapphire Technology," 5th Annual Device Research Conference, Jun. 23-25, 1997, pp. 130-131, Fort Collins, Colorado.

(Continued)

*Primary Examiner* — Stephen W Smoot
(74) *Attorney, Agent, or Firm* — Andrea Z. Warmbier; Jennifer L. Riley

(57) ABSTRACT

One aspect of the present invention is a double sided hybrid crystal structure including a trigonal Sapphire wafer containing a (0001) C-plane and having front and rear sides. The Sapphire wafer is substantially transparent to light in the visible and infrared spectra, and also provides insulation with respect to electromagnetic radio frequency noise. A layer of crystalline Si material having a cubic diamond structure aligned with the cubic <111> direction on the (0001) C-plane and strained as rhombohedron to thereby enable continuous integration of a selected (SiGe) device onto the rear side of the Sapphire wafer. The double sided hybrid crystal structure further includes an integrated III-Nitride crystalline layer on the front side of the Sapphire wafer that enables continuous integration of a selected III-Nitride device on the front side of the Sapphire wafer.

14 Claims, 3 Drawing Sheets

(51) Int. Cl.
| | |
|---|---|
| *H01L 21/02* | (2006.01) |
| *H01L 31/12* | (2006.01) |
| *H01L 27/15* | (2006.01) |
| *H01L 31/028* | (2006.01) |
| *H01L 31/0368* | (2006.01) |
| *H01L 31/18* | (2006.01) |
| *H01L 25/16* | (2006.01) |
| *H01L 33/00* | (2010.01) |

(52) U.S. Cl.
CPC .... *H01L 31/0336* (2013.01); *H01L 31/03682* (2013.01); *H01L 31/125* (2013.01); *H01L 31/1804* (2013.01); *H01L 31/1812* (2013.01); *H01L 31/1848* (2013.01); *H01L 31/1852* (2013.01); *H01L 25/167* (2013.01); *H01L 33/007* (2013.01); *H01L 2924/0002* (2013.01); *Y02E 10/544* (2013.01); *Y02E 10/546* (2013.01); *Y02E 10/547* (2013.01); *Y02P 70/521* (2015.11)

(56) References Cited

U.S. PATENT DOCUMENTS

| | | |
|---|---|---|
| 8,226,767 B2 | 7/2012 | Park et al. |
| 8,257,491 B2 | 9/2012 | Park et al. |
| 2003/0033974 A1* | 2/2003 | Ueda .................. 117/84 |
| 2007/0221946 A1 | 9/2007 | Udagawa |
| 2009/0103680 A1 | 4/2009 | Park et al. |
| 2009/0206368 A1* | 8/2009 | Park et al. .................. 257/194 |
| 2010/0133568 A1* | 6/2010 | Komatsu et al. ............ 257/98 |
| 2014/0264325 A1 | 9/2014 | Park et al. |

OTHER PUBLICATIONS

P.M. Mooney, J. A. Ott, J. O. Chu, and J. L. Jordan-Sweet, "X-ray diffraction analysis of SiGe/Si heterostructures on sapphire substrates," Applied Physics Letters, Aug. 17, 1998, vol. 73 No. 7, pp. 924-926.

Suraj J. Mathew, Guofu Niu, Wadad B. Dubbelday, John D. Cressler, John A. Ott, Jack O. Chu, Patricia M. Mooney, Karen L. Kavanagh, Bernard S. Meyerson, and Isaac Lagnado, "Hole Confinement and Low-Frequency Noise in SiGe pFET's on Silicon-on-Sapphire," IEEE Electron Device Letters, 1999, vol. 20, No. 4, pp. 173-175.

I. Lagnado. P.R. de la Houssaye, "Integration of Si and SiGe with A1203 (sapphire)," Microelectronic Engineering, 2001, vol, 99., pp. 455-499.

Hiroyuki Wado, Kentaro Ohtani, Makoto Ishida, "Epitaxal growth of SiGe on A1203 using Si2H6 gas and Ge solid source molecular beam epitaxy," Journal of Crystal Growth, 1996, vol. 169, pp. 457-452.

Yan Zhang, Gehang Zeng, Rejeev Singh, James Christofferson, Edward Croke, John E. Bowers, Ali Shakouri, "Measurement of Seebeck coefficient perpendicular to SiGe superlattice," International Conference on Thermoelectrics, 2002, pp. 1-4.

W. B. Dubbelday, K. L. Kavanagh, "The growth of SiGe on sapphire using rapid thermal chemical vapor depostion," Journal of Crystal Growth, 2001, vol. 222, pp. 20-28.

* cited by examiner

DOUBLE SIDED SI(GE)/SAPPHIRE/III-NITRIDE HYBRID STRUCTURE

CROSS-REFERENCE TO RELATED PATENT APPLICATION(S)

This patent application claims the benefit of and priority to U.S. Provisional Patent Application No. 61/783,807, filed on Mar. 14, 2013, the contents of which are hereby incorporated by reference in their entirety.

STATEMENT REGARDING FEDERALLY SPONSORED RESEARCH OR DEVELOPMENT

The invention described herein was made in part by employees of the United States Government and may be manufactured and used by or for the Government of the United States of America for governmental purposes without the payment of any royalties thereon or therefore.

FIELD OF THE INVENTION

The present invention is in the fields of solid state physics and semiconductor devices, and more specifically to a device including Si/SiGe devices that are grown on the back side of a Sapphire wafer, with III-Nitride devices such as GaN, InGaN, and AlGaN devices on the front side of the Sapphire wafer.

BACKGROUND OF THE INVENTION

Various semiconductor devices such as, for example, gallium nitride (GaN) blue, green, and UV light emitting diodes (LEDs) and laser diodes (LDs) have been developed. Various Si/SiGe devices have also been developed.

Arrangements that can utilize a Sapphire wafer are described in the following U.S. Patent Application Publications, all of which are incorporated in their entirety herein by reference: U.S. Patent Application Publication Nos. 2009/0140296, 2009/0206368, 2009/0220047, and 2010/0027746, each of which is to Park et al. As discussed in the above-identified Park '047 patent application, since the invention of the first transistor in 1947, the microelectronics industry has used a diamond structured group IV semiconductor crystal such as silicon (Si) and germanium (Ge). Another cubic compound semiconductor crystal structure, i.e. zinc-blende-alpha structure with group III-V and group II-VI, was also utilized by the semiconductor industry for the last 30 years. In the early 1990s, new semiconductor materials having different crystal structures were introduced in the microelectronics industry. Examples of such materials include gallium nitride (GaN), aluminum nitride (AlN), and indium nitride (InN) in wurtzite structure. (See S. Nakamura, T. Mukai T, M. Senoh, Japanese Journal Of Applied Physics Part 2-Letters 30 (12a): L-1998-L2001 Dec. 1, 1991.)

The term "bandgap" generally refers to the energy difference between the top of the valence band and the bottom of the conduction band of a material; this is the energy gap that enables electrons to "jump" from one band to another. "Bandgap engineering" is the process of controlling or altering the bandgap of a material by controlling the composition of its constituent semiconductor alloys. "Bandgap energy" is a fundamental design parameter for semiconductor compositions, and has been particularly important in the design of heterojunction devices, as well as photoelectric devices such as laser diodes and solar cells.

The last 60 years of combined global effort in the field has resulted in a compilation of data showing bandgap energy as a function of the lattice constants associated with various semiconductor alloy compositions, for the diamond, zinc-blende and wurtzite structured materials referred to above. (See e.g., V. Swaminathan, A. T. Macrander, Materials Aspects of GaAs and InP Based Structures, published by Prentice-Hall, p. 25 (1991); O. Ambacher, Journal of Physics D-Applied Physics 31 (20): 2653-2710 Oct. 21, 1998.)

As discussed in the Park '047 publication, new semiconductor materials with rhombohedral super-hetero epitaxial structures in various combinations of cubic, trigonal and hexagonal crystalline structures have been developed.

U.S. Patent Application Publication No. 2009/0206368 to Park et al. discloses rhombohedral cubic semiconductor materials on a trigonal substrate with single crystal properties and devices based on such materials. As discussed in the Park '368 Patent Publication, Silicon Germanium (SiGe) on Sapphire is one approach to building Silicon Germanium On Insulator (SGOI) devices such as a high mobility transistor for K-band and higher frequency applications up to 116 GHz. Because Sapphire is one of the best insulators, the high-frequency parasitic capacitance between the semiconductor layer and the substrate can be essentially eliminated. Many epitaxial growths using this approach utilize Silicon On Sapphire (SOS) and Silicon Germanium On Sapphire (SGOS) technologies which take advantage of the rectangular R-plane of Sapphire aligned with the square-faced (001) plane or rectangle-faced (110) plane of the Si and Ge diamond structure. However, this approach often shows 90° rotated twin defects. Wafer bonding of SiGe on Sapphire has also been used. On the other hand, growth of cubic SiGe layers on the trigonal (0001) plane, i.e. C-plane of Sapphire has not been utilized for device fabrication so far due to the formation of 60° rotated twin defects.

SiGe is desirable as a material for transistors and other microelectronic devices, and SiGe can also be a good thermoelectric material that can be integrated into Si microelectronic circuits. Micro-coolers based on the super lattice of SiGe and SiGeC have shown substantial cooling power on the order of 1,000 Watt/cm$^2$. A high thermoelectric figure of merit ($ZT=S^2\sigma/k$) requires low thermal conductivity (k), high electrical conductivity ($\sigma$), and high Seebeck coefficient (S). While good semiconductor device materials require a single crystalline phase without defects, many good thermoelectric materials have electrically connected poly-type crystalline structures that scatter phonons, thus reducing thermal conductivity. For example, thermoelectric skutterudite material has three pnictogen square planes that can orient randomly. The growth of SiGe on the trigonal (0001) plane of Sapphire can scatter more phonons by utilizing the poly-type structures formed by twin crystals thus increasing the thermoelectric figure of merit by reducing thermal conductivity.

As also discussed in the Park '368 Patent Application Publication, despite these potential benefits, growing Silicon Germanium in the [111] direction on the trigonally structured C-plane (0001) Sapphire has been a challenge, because this atomic alignment allows poly-type crystalline structures with 60 degree-rotated twin defects as a result of stacking faults as well as twinning on the interface with the underlying trigonal substrate. The same considerations apply to cubic crystal structures of other group IV materials, as well as group III-V and II-VI materials, and alloys thereof.

X-ray diffraction methods to perform quality control of rhombohedral SiGe (C) on C-Sapphire have been developed as disclosed in U.S. Pat. Nos. 7,769,135 and 7,558,371, both to Park et al., each of which is incorporated in their entirety herein by reference. These X-ray diffraction methods permit measuring single crystal versus twin defect ratio in full wafer scale. Prior attempts to grow single crystalline Si, SiGe, SiGeC on C-Sapphire were generally not successful because it was not known how much single crystal was formed inside the epitaxial material without destroying the sample. Transmission Electron Microscopy (TEM) can "see" twin-defect in micrometer scale only (not full wafer scale), but the sample has to be destroyed to reveal the thin atomic layer.

Prior Silicone-on-Sapphire (SOS) technology typically utilizes R-plane (1-102) Sapphire which has a rectangular plane. Silicone (100) crystal is grown on R-plane sapphire. In contrast, the present invention utilizes C-plane (0001) Sapphire which has a triangle plane, and a Si(Ge)(C) (111) crystal is grown thereon.

BRIEF SUMMARY OF THE INVENTION

One aspect of the present invention is a double sided hybrid crystal structure including a trigonal Sapphire wafer having a (0001) C-plane and having front and rear sides. The Sapphire wafer is substantially transparent to light in the visible and infrared spectra, and also provides insulation with respect to electromagnetic radio frequency noise. The structure includes a layer of crystalline Si material having a cubic diamond structure aligned with the cubic <111> direction on the (0001) C-plane and strained as rhombohedron to thereby enable continuous integration of a selected (SiGe) device onto the rear side of the Sapphire wafer. In some embodiments, the structure includes a layer of crystalline group IV materials comprising one or more of Si, Ge and C and having a cubic diamond structure aligned with the cubic <111> direction on the (0001) C-plane and strained as rhombohedron to thereby enable continuous integration of a selected (SiGe) and/or Si(Ge)(C) device onto the rear side of the Sapphire wafer. The double sided hybrid crystal structure further includes an integrated III-Nitride or ZnO crystalline layer on the front side of the Sapphire wafer that enables continuous integration of a selected III-Nitride or ZnO device onto the front side of the Sapphire wafer.

Another aspect of the present invention is to provide a method of fabricating a hybrid structure by providing a C-plane Sapphire wafer having first and second opposite sides, forming a plurality of first layers on the first side of the Sapphire wafer, wherein each of the first layers has a material selected from the group consisting of III-Nitride and ZnO materials; and further forming a plurality of Si/SiGe(C) layers on the second side of the Sapphire wafer utilizing an epitaxial growth process.

These and other features, advantages, and objects of the present invention will be further understood and appreciated by those skilled in the art by reference to the following specification, claims, and appended drawings.

DETAILED DESCRIPTION OF EMBODIMENTS

Figure 2:
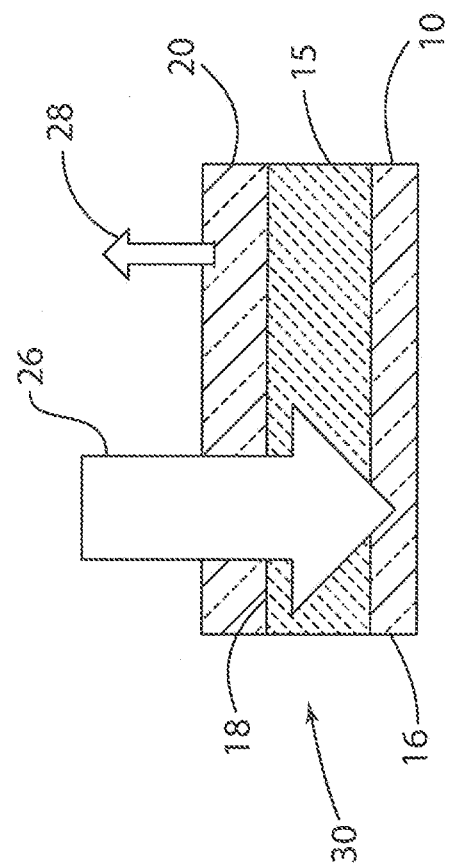
FIG. 2 is a schematic view of a device having a III-Nitride LED/LD structure on a front side of a Sapphire wafer and a Si/SiGe device layer on the back side.

For purposes of description herein, the terms "upper," "lower," "right," "left," "rear," "front," "vertical," "horizontal," and derivatives thereof shall relate to the invention as oriented in FIG. 2. However, it is to be understood that the invention can assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Technologies that have recently been developed allow the growth of single crystalline Si and SiGe on C-plane Sapphire. It is described as Rhombohedral super hetero epitaxy because Si and SiGe of cubic diamond structure is aligned with cubic <111> direction on trigonal Sapphire's (0001) C-plane and Si/SiGe can be strained as Rhombohedron in this atomic alignment. C-plane Sapphire is the most common substrate for the growth of III-Nitride semiconductor devices such as Gallium Nitrides (GaN) Blue, Green, and ultra violet ("UV") Light Emitting Diodes ("LED"s) and Laser Diodes ("LD"s).

Figure 1:
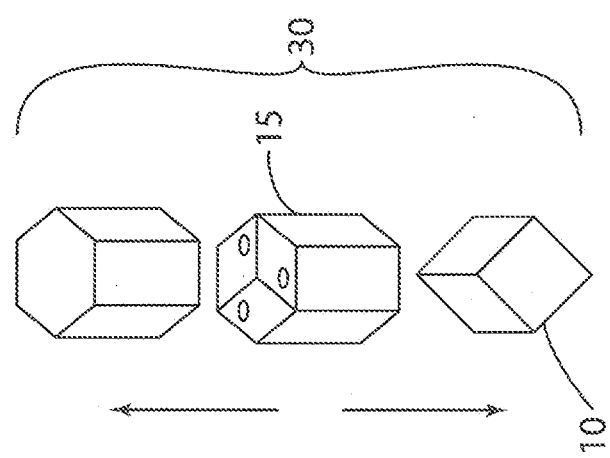
FIG. 1 is a fragmentary isometric/schematic view of a hybrid double sided epitaxy with rhombohedral super hetero epitaxy.

A hybrid crystal growth technology utilized in the present invention includes use of Rhombohedral super-hetero epitaxy which provides for the growth of Si/SiGe devices 10 (FIGS. 1 and 2) on the back side 16 of a Sapphire wafer 15. Also, III-Nitride devices 20 such as GaN, InGaN, and AlGaN devices are grown on the front side 18 of a Sapphire wafer 15. This hybrid epitaxy creates a device/structure 30 having continuously integrated single crystalline layers 10, 20 with different crystal structures on the front and back sides of a Sapphire wafer 15. The hybrid layer structure 30 provides for integration of III-Nitride devices 20 (such as LEDs and LDs) on the front side 18 of a Sapphire wafer 15, and Si/SiGe devices 10 (such as solar cell, logic devices, or RF devices) on the back side 16 of a Sapphire wafer 15 as shown in FIGS. 1 and 2.

The two layers 10 and 20 are electrically separated by Sapphire layer or wafer 15. Sapphire is a good insulator, but it is optically transmittable since Sapphire is transparent in visible and IR spectra. Unlike prior GaN on SiC technologies in which a GaN layer is electrically connected to a SiC substrate, a hybrid double sided epitaxy according to the present invention allows electric separation of the GaN layer 20 and the Si/SiGe layer 10 so that the Si/SiGe layer 10 can operate at extremely high frequencies above several hundred gigahertz. This is possible because it is based on Si/SiGe material on a Sapphire insulator (i.e. Silicon-On-Insulator (SOI) and Silicon-On-Sapphire (SOS) technologies).

Because Sapphire is a good insulator, it does not produce substrate capacitance related parasitic RF noises and leaks at high frequencies. In contrast, known Si/SiGe on Si wafer or SiC wafer technologies can have problems (e.g. parasitic noises and leaks) that are associated with substrate capacitance.

Figure 3:
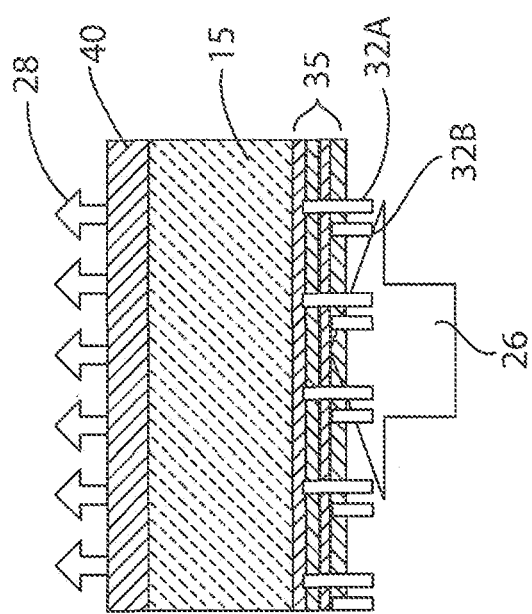
FIG. 3 is a schematic cross-sectional view of a structure including an Si/SiGe layer on the backside of a Sapphire wafer that functions as a solar cell, with a front side (GaN-side) illumination in combination with back-side (silicon-side) illumination.
Figure 4:
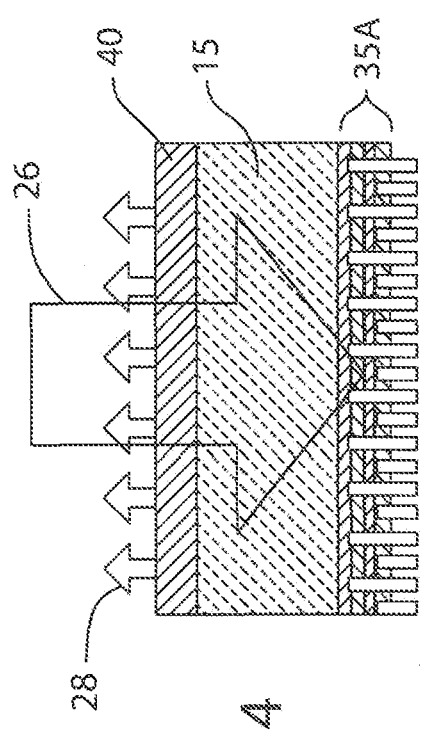
FIG. 4 is a schematic cross-sectional view of a structure/device wherein front-side illumination through transparent Sapphire is utilized in connection with dense metal electrodes.

A transparent Sapphire substrate 15 utilized with a wide bandgap III-nitride device layer according to the present invention does not block the sunlight 26 (FIG. 2) from the front side 24 of the device/structure 30. Therefore, the Si/SiGe layer 10 on the back side 16 of the Sapphire 15 can work as a solar cell 35 with the front-side 18 (GaN-side) providing LED/light illumination 28 as well as the backside illumination 32A and 32B as shown in FIG. 3. With reference to FIG. 4, front side illumination of solar cell 35A through the transparent Sapphire 15 allows dense (closely spaced) metal electrodes 32A and 32B that do not block the sun light 26 and shorter carrier travel distance, thereby delivering more photo-voltaic currents.

Figure 5:
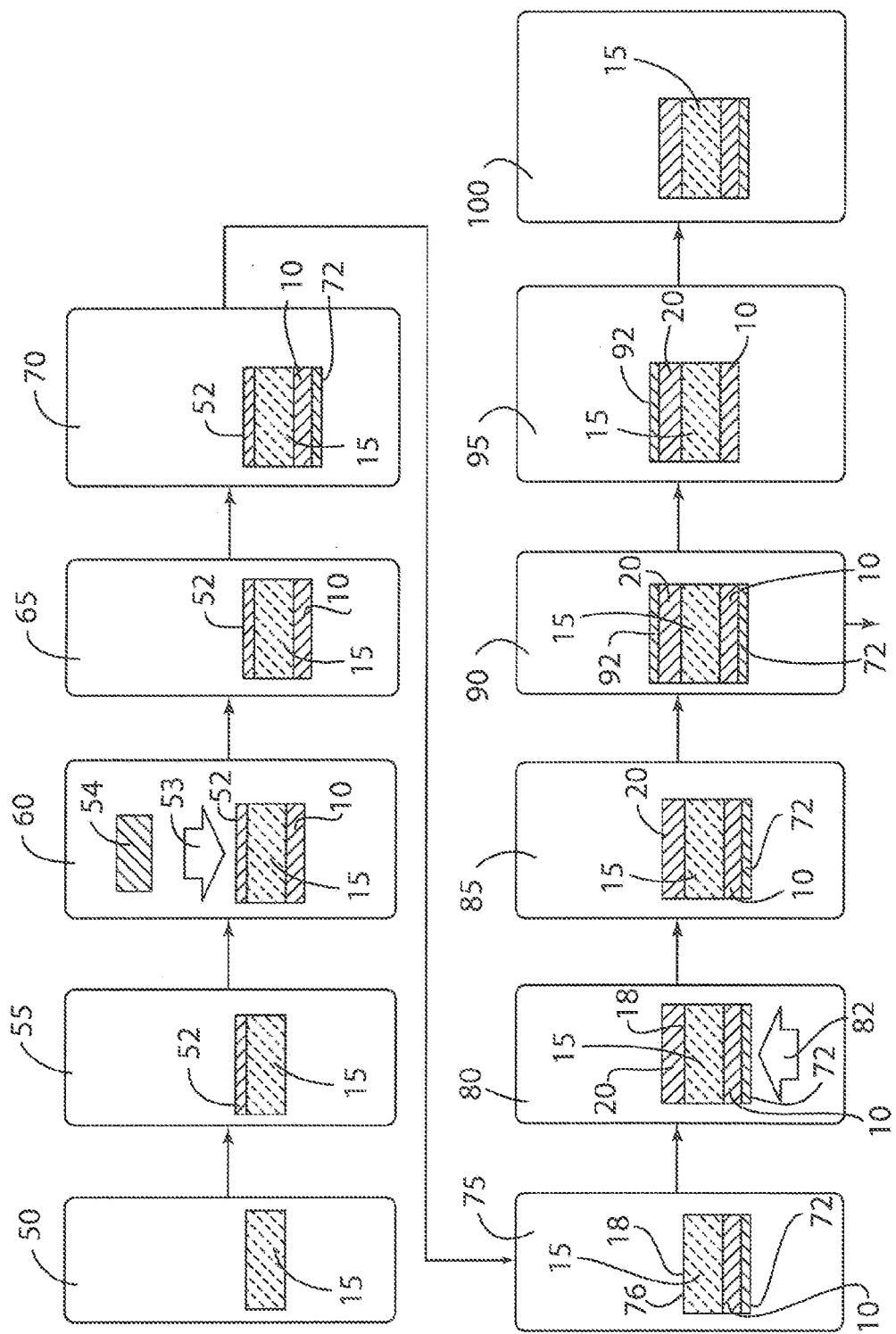
FIG. 5 is a flow chart showing a process that may be utilized to fabricate a double sided Si(Ge)/Sapphire/III-Nitride hybrid structure.

With reference to FIG. 5, a process of fabricating a multi layer hybrid structure 30 includes providing a C-plane Sapphire wafer 15 at step 50. Processes for fabricating C-plane Sapphire wafers are known, such that step 50 will not be described in detail. An optional heat absorption layer 52 such as Carbon (C) or Titanium (Ti) can be disposed (for example, by deposition) on one side of the Sapphire wafer 15 at step 55 utilizing a suitable known process. A substrate heater 54 is utilized to apply IR heat 53 to raise the temperature of the Sapphire layer 15 to the optimum growth temperature for rhombohedrally aligned Si/SiGe on C-plane Sapphire. The optional heat absorbing layer 52 absorbs more IR heat 53 and assists in maintaining a uniform high substrate temperature. It will be understood that other heating methods and processes may also be utilized.

At step 60, Si/SiGe layers 10 are grown on the back side of the Sapphire wafer 15 utilizing a known epitaxial growth method. Examples of such processes include sputtering, molecular beam epitaxy ("MBE"), metalorganic chemical vapor deposition ("MOCVD"), physical vapor epitaxy (PVE), hydride vapor phase epitaxy ("HYPE"), e-Beam deposit, liquid phase epitaxy ("LPE"), low pressure chemical vapor deposit (LPCVD), etc. The fabrication process can further include optional Si/SiGe device pre-fabrication processes such as chemical-mechanical polishing ("CMP"), dopant drive-in, ion-implantation, and other such processes, which can optionally be performed at step 65. The deposition or growth of a protection layer 72 is performed at step 70. The protection layer 72 protects the Si/SiGe layer 10 during formation of the III-Nitride structures.

In step 75, the optional heat absorbing layer 52 is removed (if necessary) utilizing a suitable known etching process such as for example, wet etching, dry etching, plasma etching, reactive ion etching, or the like to form an exposed Sapphire surface 76. Then, at step 80, heat 82 is applied and III-Nitride layers 20 such as, for example, GaN, AlN, aluminum gallium nitride (AlGaN), indium gallium nitride (InGaN), and InN are grown on the exposed surface 76 of the front side 18 of C-plane Sapphire (opposite side from Si/SiGe layers). III-Nitride processes are known in the art, and this step in the process will not therefore be described in detail. Known III-Nitride pre-device fabrication processes such as, for example, chemical-mechanical polishing ("CMP"), dopant drive-in, ion-implantation, and the like can be performed in step 85. In step 90, a second protection layer 92 (such as, for example, silicon oxide or silicon nitride) is deposited or grown utilizing known processes. The second protection layer 92 protects the III-Nitride layers 20. After step 90, the hybrid wafer 30 with Si/SiGe layers 10 and III-Nitride layers 20 can be used as a wafer product.

It will be understood that steps 65 and 85 are optional, and may or may not be included in a process for manufacturing a hybrid wafer product according to the present invention.

After step 90, the hybrid wafer product can be further processed by removing and depositing each protection layer at a time and performing further post-wafer device fabrications as steps 95 and 100 in order make full hybrid circuit with Si/SiGe 10 on one side and III-Nitride 20 on the other side. A double sided hybrid wafer product 30 can be commercialized after stop 90 and full hybrid devices/products can be commercialized after step 100. It will be understood that it is possible to exchange the order of growth and device fabrication sequences of Si/SiGe and III-Nitrides such that III-Nitrides are grown first and Si/SiGe layers are grown later. The double sided hybrid crystal growth technology described above also applies to Si(Ge)/Sapphire/ZnO hybrid structure as well since ZnO has the same Wurtzite crystal structure as III-Nitride on C-plane Sapphire.

Growth of the Si/SiGe and III-Nitrides during the process illustrated in FIG. 5 can be adjusted utilizing x-ray diffraction methods as described in U.S. Pat. Nos. 7,769,135 and 7,558,371. Use of these x-ray diffraction methods provides quality control and permits the optimum growth parameters for forming hybrid crystals with more than 99% single crystallinity. These x-ray diffraction methods permit measuring the single crystal versus twin defect ratio in full wafer scale.

It will be understood that the principles and processes described above can also be utilized with SiGeC alloy in addition to SiGe alloy on C-plane sapphire. Si, Ge, and C are group IV semiconductor materials that can readily build the rhombohedral double side structure with GaN in a substantially similar epitaxy.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." As used herein, the term "and/or" includes any and all combinations of one or more of the associated listed items. As also used herein, the term "combinations thereof" includes combinations having at least one of the associated listed items, wherein the combination can further include additional, like non-listed items. Further, the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

Reference throughout the specification to "another embodiment", "an embodiment", "exemplary embodiments", and so forth, means that a particular element (e.g., feature, structure, and/or characteristic) described in connection with the embodiment is included in at least one embodiment described herein, and can or cannot be present in other embodiments. In addition, it is to be understood that the described elements can be combined in any suitable manner in the various embodiments and are not limited to the specific combination in which they are discussed.

This written description uses examples to disclose the invention, including the best mode, and also to enable any person skilled in the art to make and use the invention. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A double sided hybrid crystal structure, comprising:
   trigonal Sapphire wafer defining a (0001) C-plane and having front and rear sides, the Sapphire wafer being substantially transparent to light in the visible and infrared spectra and also providing insulation with respect to electromagnetic radio frequency noise;
   a layer of crystalline group IV material comprising one or more of Si, Ge and C and having a cubic diamond structure aligned with the cubic <111>direction on the (0001) C-plane and strained as rhonmbohedron to thereby enable continuous integration of a selected Si(Ge)(C) device onto the rear side of the Sapphire wafer;
   an integrated crystalline layer on the front side of the Sapphire wafer, wherein the crystalline layer on the front side of the sapphire comprises a material, wherein the material comprises a III-Nitride material or a ZrO material that enables continuous integration of a selected III-Nitride or ZnO device on the front side of the Sapphire wafer.

2. The hybrid crystal structure of claim 1, wherein the crystalline layer on the front side comprises the III-Nitride material.

3. The hybrid crystal structure of claim 2, wherein the III-Nitride crystalline layer comprises a hexagonal crystal structure.

4. The hybrid crystal structure of claim 3, wherein the III-Nitride crystalline layer comprises a device that is a light emitting semiconductor device, a light sensitive device, or a wide-bandgap transistor device.

5. The hybrid crystal structure of claim 4, wherein the device comprises a light emitting diode.

6. The hybrid crystal structure of claim 4, wherein the device comprises a light emitting semiconductor device that emits a light, wherein the light is selected from the group consisting of blue light, green light, ultraviolet light, and any combinations thereof.

7. The hybrid crystal structure of claim 4, wherein the device comprises an ultra violet detector.

8. The hybrid crystal structure of claim 4, wherein the device comprises a temperature sensor.

9. The hybrid crystal structure of claim 3, wherein the III-Nitride device comprises a laser diode.

10. The hybrid crystal structure of claim 1, wherein the layer of crystalline Group IV material comprises a solar cell.

11. The hybrid crystal structure of claim 10, wherein the solar cell comprises a substantially mono crystalline Group IV material with at least about 70% single crystalline material as determined by X-ray diffraction.

12. The hybrid crystal structure of claim 11, wherein the solar cell comprises a plurality of metal electrodes.

13. The hybrid crystal structure of claim 1, wherein the layer of crystalline Group IV material comprises Si material forming a solar cell.

14. The hybrid crystal structure of claim 1, wherein the sapphire wafer has a substantially uniform thickness with oppositely-facing planar surfaces.

* * * * *